(12) United States Patent
Kim et al.

(10) Patent No.: US 8,549,715 B2
(45) Date of Patent: Oct. 8, 2013

(54) PIEZOELECTRIC MICROSPEAKER AND METHOD OF FABRICATING THE SAME

(75) Inventors: Dong-kyun Kim, Suwon-si (KR); Seok-whan Chung, Suwon-si (KR); Byung-gil Jeong, Anyang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1111 days.

(21) Appl. No.: 12/428,502

(22) Filed: Apr. 23, 2009

(65) Prior Publication Data

US 2010/0072860 A1 Mar. 25, 2010

(30) Foreign Application Priority Data

Sep. 22, 2008 (KR) .................. 10-2008-0092844

(51) Int. Cl.
| | | |
|---|---|---|
| H01L 41/22 | (2013.01) | |
| H04R 17/00 | (2006.01) | |
| B21D 53/76 | (2006.01) | |
| B23P 17/00 | (2006.01) | |

(52) U.S. Cl.
USPC ........................................ 29/25.35; 29/890.1

(58) Field of Classification Search
USPC ............... 29/25.35, 890.1; 257/254; 310/311, 310/316.01, 317; 181/158; 347/68
See application file for complete search history.

(56) References Cited

U.S. PATENT DOCUMENTS

| | | | | |
|---|---|---|---|---|
| 4,816,125 A | * | 3/1989 | Muller et al. ............ | 204/192.18 |
| 5,025,346 A | * | 6/1991 | Tang et al. ................ | 361/283.1 |
| 5,049,775 A | * | 9/1991 | Smits ............................ | 310/328 |
| 5,162,691 A | * | 11/1992 | Mariani et al. ................ | 310/321 |
| 5,209,118 A | * | 5/1993 | Jerman ............................ | 73/715 |
| 5,260,596 A | * | 11/1993 | Dunn et al. .................... | 257/414 |
| 5,633,552 A | * | 5/1997 | Lee et al. ....................... | 310/311 |
| 6,857,501 B1 | * | 2/2005 | Han et al. ....................... | 181/158 |
| 6,967,362 B2 | * | 11/2005 | Nam et al. ..................... | 257/254 |
| 7,089,638 B2 | * | 8/2006 | Yi et al. ......................... | 29/25.35 |
| 2006/0010670 A1 | * | 1/2006 | Kitahara ........................ | 29/25.35 |
| 2006/0137180 A1 | * | 6/2006 | Ito et al. ........................ | 29/890.1 |
| 2009/0154734 A1 | * | 6/2009 | Jeong et al. ................... | 381/173 |
| 2010/0074459 A1 | * | 3/2010 | Chung et al. .................. | 381/190 |
| 2010/0156238 A1 | * | 6/2010 | Kim et al. ...................... | 310/322 |
| 2011/0038495 A1 | * | 2/2011 | Jeong et al. ................... | 381/190 |
| 2011/0051985 A1 | * | 3/2011 | Hwang et al. ................. | 381/396 |

(Continued)

FOREIGN PATENT DOCUMENTS

| | | |
|---|---|---|
| JP | 2001-025095 A | 1/2001 |
| KR | 10-2003-0062897 A | 7/2003 |

(Continued)

*Primary Examiner* — David Angwin
(74) *Attorney, Agent, or Firm* — Sughrue Mion, PLLC

(57) ABSTRACT

A piezoelectric microspeaker fabricated by a method including: forming a lower drive unit by forming a first drive electrode by depositing and etching a first thin conductive layer on a substrate, forming a first piezoelectric plate by depositing and etching a first piezoelectric layer on the first drive electrode, and forming a first common electrode by depositing and etching a second conductive layer on the first piezoelectric plate; after forming the lower drive unit, forming a diaphragm by depositing a non-conductive layer on the first common electrode; and forming an upper drive unit by forming a second common electrode by depositing and etching a third conductive layer on the diaphragm, forming a second piezoelectric plate by depositing and etching a second piezoelectric layer on the second common electrode, and forming a second drive electrode by depositing and etching a fourth conductive layer on the second piezoelectric plate.

9 Claims, 8 Drawing Sheets

(56) References Cited

U.S. PATENT DOCUMENTS

| | | |
|---|---|---|
| 2011/0064250 A1 | 3/2011 | Jeong et al. |
| 2011/0075867 A1 | 3/2011 | Chung et al. |
| 2011/0075879 A1 | 3/2011 | Kim et al. |
| 2011/0085684 A1 | 4/2011 | Kim et al. |

FOREIGN PATENT DOCUMENTS

| | | |
|---|---|---|
| KR | 10-2003-0062899 A | 7/2003 |
| KR | 10-2003-0090189 A | 11/2003 |
| KR | 10-2004-0026756 A | 4/2004 |
| KR | 100466808 B1 | 1/2005 |
| KR | 10-2005-0076150 A | 7/2005 |
| KR | 100512960 B1 | 9/2005 |
| KR | 10-2006-0093464 A | 8/2006 |
| KR | 10-2006-0127013 A | 12/2006 |
| KR | 100756532 B1 | 9/2007 |
| KR | 20090063950 A | 6/2009 |
| KR | 20100033807 A | 3/2010 |
| KR | 20100034883 A | 4/2010 |
| KR | 20100071607 A | 6/2010 |
| KR | 20110016667 A | 2/2011 |
| KR | 10-2011-0029812 A | 3/2011 |
| KR | 10-2011-0033593 A | 3/2011 |
| KR | 20110023535 A | 3/2011 |
| KR | 10-2011-0034960 A | 4/2011 |
| KR | 10-2011-0039815 A | 4/2011 |
| WO | 2005/053357 A1 | 6/2005 |

* cited by examiner

PIEZOELECTRIC MICROSPEAKER AND METHOD OF FABRICATING THE SAME

CROSS-REFERENCE TO RELATED APPLICATION

This application claims priority from Korean Patent Application No. 10-2008-0092844, filed on Sep. 22, 2008, the disclosure of which is incorporated herein in its entirety by reference.

BACKGROUND

1. Field

One or more embodiments relate to a microspeaker, and more particularly, to a micro-electro-mechanical systems (MEMS)-based piezoelectric microspeaker and a method of fabricating the same.

2. Description of the Related Art

The piezoelectric effect is the reversible conversion of mechanical energy into electrical energy using a piezoelectric material. In other words, the piezoelectric effect is a phenomenon in which a potential difference is generated when pressure or vibration is applied to a piezoelectric material, and the piezoelectric material deforms or vibrates when a potential difference is applied thereto.

Piezoelectric speakers use the principle of applying a potential difference to a piezoelectric material to deform or vibrate the piezoelectric material and generating sound according to the vibration.

With the rapid progress of personal mobile communication, research on a subminiature acoustic transducer has been carried out for several decades. In particular, piezoelectric microspeakers have been researched due to their simple structures and ability to operate at low voltage.

In general, a piezoelectric microspeaker includes a piezoelectric plate having an electrode layer formed on each side, and a non-piezoelectric diaphragm. When voltage is applied through the electrode layers, the piezoelectric plate is deformed, which causes the diaphragm to vibrate and generate sound.

However, since the piezoelectric microspeaker has a lower sound output level than a voice coil microspeaker, there are few cases of it being put to practical use. Thus, a piezoelectric microspeaker which has a small size and a high sound output level is needed.

SUMMARY

A method of fabricating a piezoelectric microspeaker, according to an embodiment, includes forming a lower drive unit by forming a first drive electrode by depositing and etching a thin first conductive layer on a substrate, forming a first piezoelectric plate by depositing and etching a thin first piezoelectric layer on the first drive electrode, and forming a first common electrode by depositing and etching a thin second conductive layer on the first piezoelectric plate; a diaphragm forming step of forming a diaphragm by depositing and etching a thin non-conductive layer on the first common electrode; and an upper drive unit forming step of: forming a second common electrode by depositing and etching a thin third conductive layer on the diaphragm, forming a second piezoelectric plate by depositing and etching a second thin piezoelectric layer on the second common electrode, and forming a second drive electrode by depositing and etching a thin fourth conductive layer on the second piezoelectric plate.

A method of fabricating a piezoelectric microspeaker, according to another embodiment, includes: forming a lower drive unit by depositing and etching a thin first conductive layer and a thin first piezoelectric layer on a substrate in sequence; forming a diaphragm by depositing and etching a thin second conductive layer on the lower drive unit; and forming an upper drive unit by depositing and etching a thin second piezoelectric layer and a thin third conductive layer on the diaphragm in sequence.

The method may further include: before forming the lower drive unit, etching a part of the substrate to form a cavity in which the lower drive unit is subsequently formed.

A piezoelectric microspeaker, according to another embodiment, is fabricated according to one of the above-described methods.

It is to be understood that both the foregoing general description and the following detailed description are exemplary and explanatory and are intended to provide further explanation of embodiments.

BRIEF DESCRIPTION OF THE DRAWINGS

The above and/or other aspects will become apparent and more readily appreciated from the following description of the embodiments, taken in conjunction with the accompanying drawings of which.

DETAILED DESCRIPTION

Figure 1:
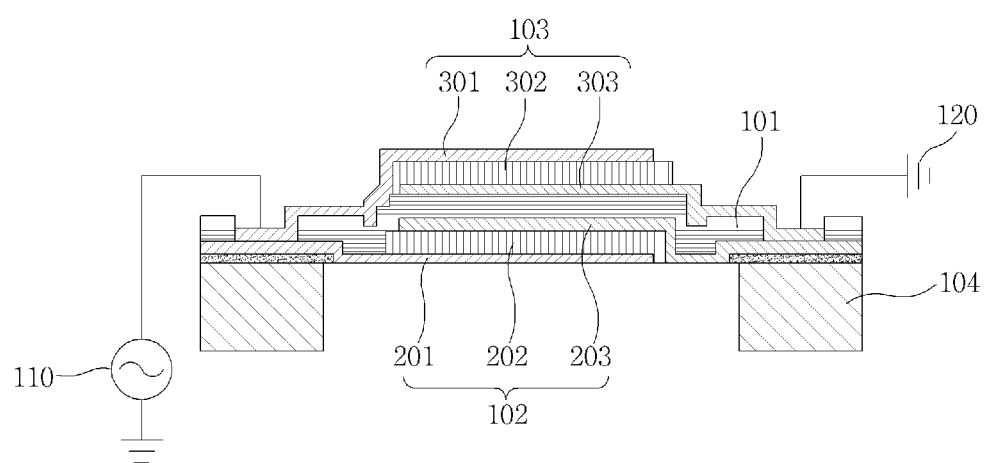
FIG. 1 is a cross-sectional view of a piezoelectric microspeaker according to an embodiment.

Embodiments are described more fully hereinafter with reference to the accompanying drawings, in which embodiments are shown. The general inventive concept may, however, be embodied in many different forms and should not be construed as limited to the embodiments set forth herein. Rather, these embodiments are provided so that this disclosure is thorough, and will fully convey the scope to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it may be directly on or directly connected to the other element or layer, or intervening elements or layers may be present. In contrast, when an element is referred to as being "directly on" or "directly connected to" another element or layer, there are no intervening elements or layers present.

FIG. 1 is a cross-sectional view of a piezoelectric microspeaker according to an embodiment.

Referring to FIG. 1, the piezoelectric microspeaker according to this embodiment includes a diaphragm 101, a lower drive unit 102 and an upper drive unit 103. The lower drive unit 102 and the upper drive unit 103 may be symmetrically formed with respect to the diaphragm 101. The lower and upper drive units 102 and 103 may include drive electrodes 201 and 301 connected to a drive power source 110, piezoelectric plates 202 and 302 which deform according to an applied voltage, and common electrodes 203 and 303 connected to a common power source 120.

The first drive electrode 201 and the second drive electrode 301 may be connected with each other and to the drive power source 110, and the first common electrode 203 and the second common electrode 303 may be connected with each other and to the common power source. For example, the drive power source may be an alternating current (AC) power source 110, and the common power source 120 may be ground which provides a reference value of voltage generated from the AC power source 110.

When the power sources 110 and 120 are connected as described above, electric fields are generated between the first drive electrode 201 and the first common electrode 203 and between the second drive electrode 301 and the second common electrode 303, respectively. According to the generated electric fields, the piezoelectric plates 202 and 302 may deform, and the deformation may be applied to the diaphragm 101. For example, when an AC voltage is applied to the piezoelectric microspeaker according to this embodiment, the piezoelectric plates 202 and 302 repeatedly contract and expand according to a change in voltage, which causes the diaphragm 101 to vibrate and generate sound.

Here, the electric fields generated between the first drive electrode 201 and the first common electrode 203 and between the second drive electrode 301 and the second common electrode 303 point in opposite directions. For example, a downward electric field may be generated between the first drive electrode 201 and the first common electrode 203, and an upward electric field may be generated between the second drive electrode 301 and the second common electrode 303. Thus, the deformation directions of the first piezoelectric plate 202 and the second piezoelectric plate 302 are also opposite to each other. Assuming that the first and second piezoelectric plates 202 and 302 have, for example, a disk shape, the second piezoelectric plate 302 may contract toward its center when the first piezoelectric plate 202 expands from its center to the periphery. Due to the piezoelectric plates 202 and 302 deforming in opposite directions under and on the diaphragm 101, respectively, a deformation efficiency of the diaphragm 101 can be improved.

In the piezoelectric microspeaker of FIG. 1 according to this embodiment, the diaphragm 101 and the drive units 102 and 103 may be formed by depositing various materials in the form of thin layers on a substrate 104 and etching the deposited layers in specific shapes using a semiconductor fabrication process.

FIGS. 2(a) to 2(e) are cross-sectional views illustrating a method of fabricating a piezoelectric microspeaker according to an embodiment. This may serve as an example of a method of fabricating the piezoelectric microspeaker of FIG. 1.

The method of fabricating the piezoelectric microspeaker according to this embodiment will be described below with reference to FIGS. 1 and 2A to 2E.

Figure 2A:
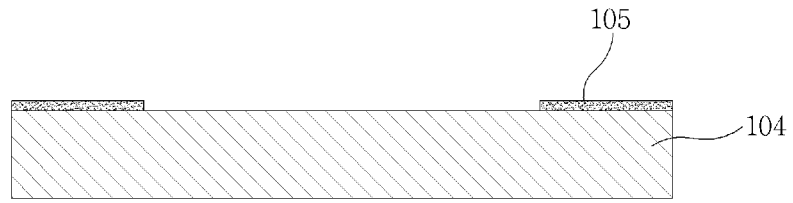
FIGS. 2A to 2E are cross-sectional views illustrating a method of fabricating a piezoelectric microspeaker according to an embodiment.

First, as illustrated in FIG. 2A, an insulating layer 105 is formed by oxidizing the upper surface of the substrate 104 or depositing and etching a thin insulating layer on the substrate 104. The insulating layer 105 provides insulation between the lower drive unit 102 to be formed and the substrate 104.

Figure 2B:
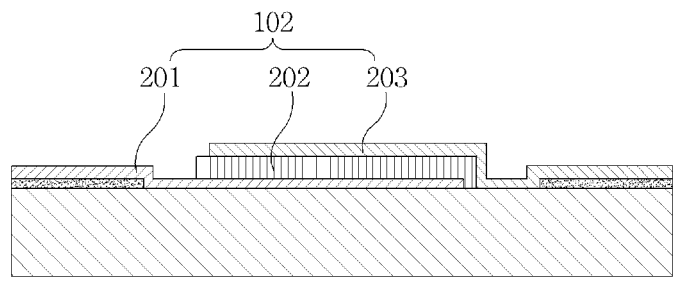

Subsequently, as illustrated in FIG. 2B, the first drive electrode 201, the first piezoelectric plate 202 and the first common electrode 203 are formed by depositing and etching a thin conductive layer, a thin piezoelectric layer, and a thin conductive layer in sequence. The first drive electrode 201, the first piezoelectric plate 202, and the first common electrode 203 may constitute the lower drive unit 102 formed under the diaphragm 101.

Figure 2C:
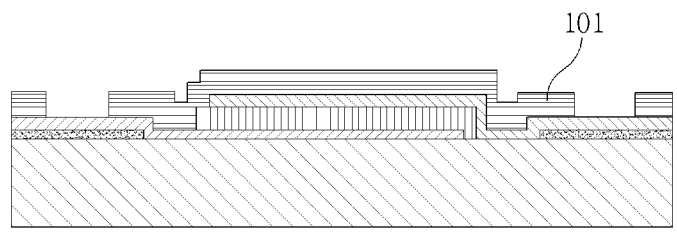

Subsequently, as illustrated in FIG. 2C, the diaphragm 101 is formed by depositing and etching a thin polymer layer. At this time, the center of the diaphragm 101 can be formed to protrude according to the shape of the lower drive unit 102.

Figure 2D:
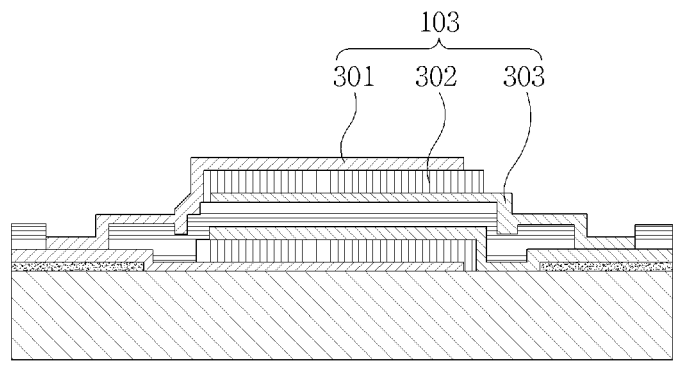

Subsequently, as illustrated in FIG. 2D, the second common electrode 303, the second piezoelectric plate 302 and the second drive electrode 301 are formed by depositing and etching a thin conductive layer, a thin piezoelectric layer and a thin conductive layer in sequence. The second common electrode 303, the second piezoelectric plate 302 and the second drive electrode 301 may constitute the upper drive unit 103 formed on the diaphragm 101. In addition, in this process, the first drive electrode 201 can be electrically connected with the second drive electrode 301, and the first common electrode 203 can be electrically connected with the second common electrode 303.

Figure 2E:
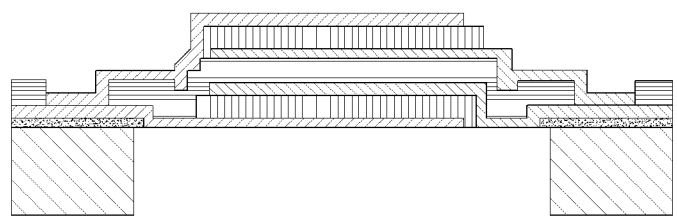

Finally, as illustrated in FIG. 2E, the diaphragm 101 is released by etching through the lower side of the substrate 104.

Figure 3:
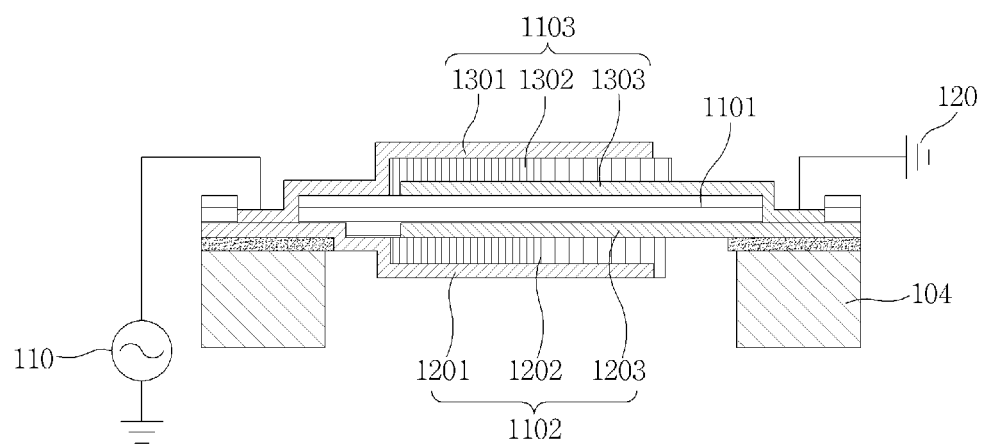
FIG. 3 is a cross-sectional view of a piezoelectric microspeaker according to another embodiment.

FIG. 3 is a cross-sectional view of a piezoelectric microspeaker according to another embodiment.

Referring to FIG. 3, in the piezoelectric microspeaker according to this embodiment, a lower drive unit 1102 and an upper drive unit 1103 may be symmetrically formed with respect to a diaphragm 1101. The lower and upper drive units 1102 and 1103 may include drive electrodes 1201 and 1301 connected to a drive power source 110, piezoelectric plates 1202 and 1302 deforming according to voltage, and common electrodes 1203 and 1303 connected to a common power source 120.

The structure of FIG. 3 is different from the structure of FIG. 1 in that the diaphragm 1101 is formed to be flat. More specifically, while the center of the diaphragm 101 protrudes in the structure of FIG. 1 such that the edge of the diaphragm 101 is disposed at the same level as the lower drive unit 102, the lower drive unit 1102 is formed at a relatively lower level in the structure of FIG. 3 such that the edge and center of the diaphragm 1101 are at the same level.

As described above, the first drive electrode 1201 and the second drive electrode 1301 may be connected to the drive power source 110, and the first common electrode 1203 and the second common electrode 1303 may be connected to the common power source 120. Thus, the deformation directions of the first piezoelectric plate 202 and the second piezoelectric plate 1302 are opposite to each other.

FIGS. 4A to 4E are cross-sectional views illustrating a method of fabricating a piezoelectric microspeaker according to another embodiment. This may serve as an example of a method of fabricating the piezoelectric microspeaker of FIG. 3.

The method of fabricating the piezoelectric microspeaker according to this embodiment will be described below with reference to FIGS. 3 and 4A to 4E.

Figure 4A:
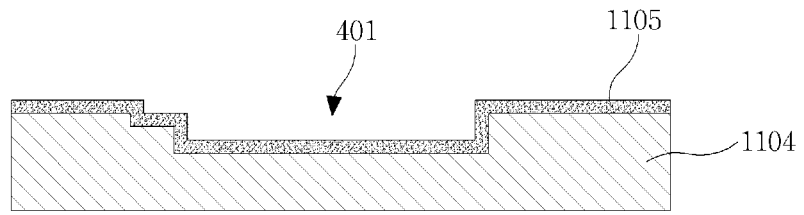
FIGS. 4A to 4E are cross-sectional views illustrating a method of fabricating a piezoelectric microspeaker according to another embodiment.

First, as illustrated in FIG. 4A, a cavity 401 is formed by etching a part of a substrate 1104 to make a space in which the lower drive unit 1102 will be formed, and an insulating layer 1105 is formed by oxidizing the substrate 1104 or by depositing a thin insulating layer on the substrate 1104.

Figure 4B:
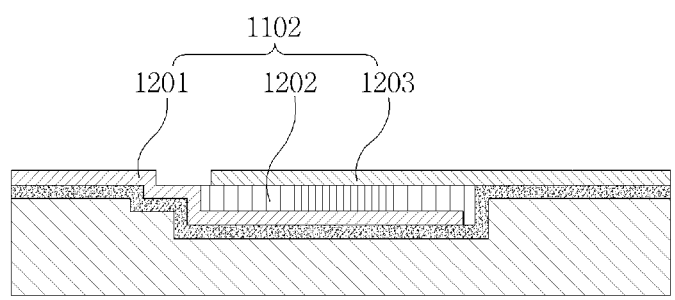

Subsequently, as illustrated in FIG. 4B, the first drive electrode 1201, the first piezoelectric plate 1202 and the first common electrode 1203 are formed by depositing and etching a thin conductive layer, a thin piezoelectric layer and a thin conductive layer in sequence. The first drive electrode 1201, the first piezoelectric plate 1202 and the first common electrode 1203 may constitute the lower drive unit 1102 formed under the diaphragm 1101.

Figure 4C:
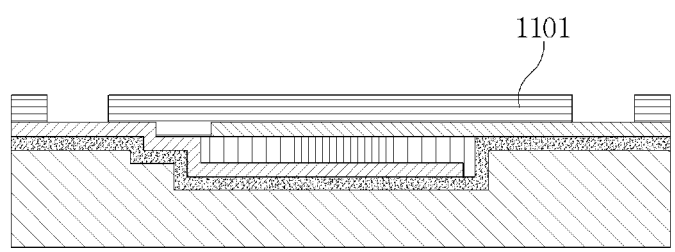

Subsequently, as illustrated in FIG. 4C, the diaphragm 1101 is formed by depositing and etching a thin polymer layer. At this time, a part of the lower drive unit 1102 is within the cavity 401 of the substrate 1104, and thus the diaphragm 1101 can be formed to be substantially flat.

Figure 4D:
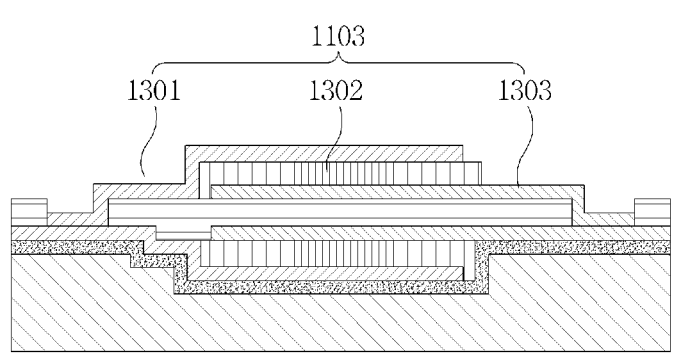

Subsequently, as illustrated in FIG. 4D, the second common electrode 1303, the second piezoelectric plate 1302 and the second drive electrode 1301 are formed by depositing and etching a thin conductive layer, a thin piezoelectric layer and a thin conductive layer in sequence. The second common electrode 1303, the second piezoelectric plate 1302 and the second drive electrode 1301 may constitute the upper drive unit 1103 formed on the diaphragm 1101. In addition, in this process, the first drive electrode 1201 can be electrically connected with the second drive electrode 1301, and the first common electrode 1203 can be electrically connected with the second common electrode 1303.

Figure 4E:
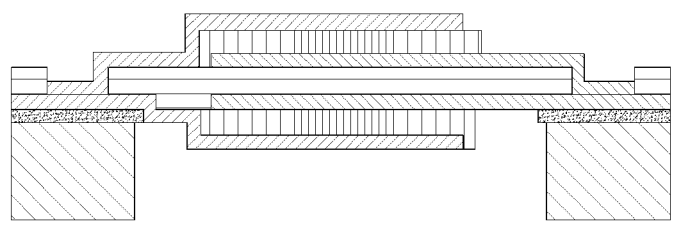

Finally, as illustrated in FIG. 4E, the diaphragm 1101 is released by etching through the lower side of the substrate 104.

Figure 5:
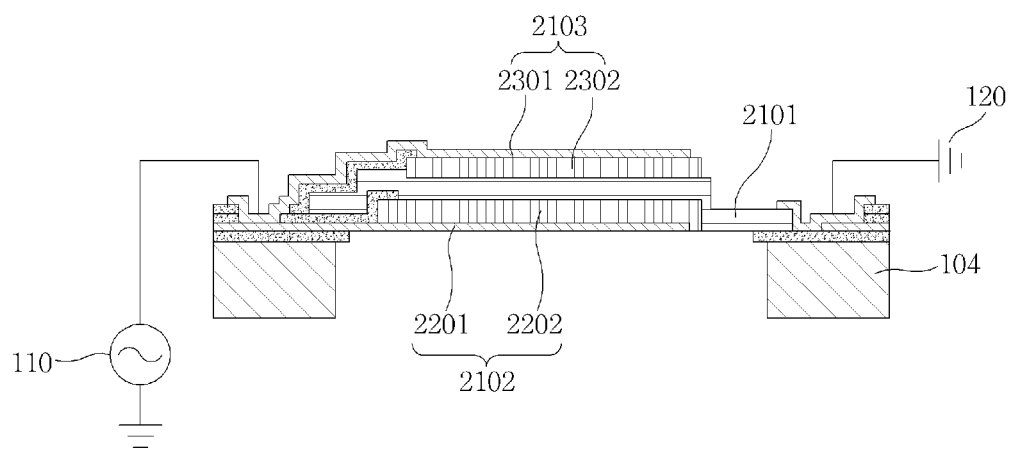
FIG. 5 is a cross-sectional view of a piezoelectric microspeaker according to yet another embodiment.

FIG. 5 is a cross-sectional view of a piezoelectric microspeaker according to yet another embodiment.

Referring to FIG. 5, in the piezoelectric microspeaker according to this embodiment, a lower drive unit 2102 and an upper drive unit 2103 may be symmetrically formed with respect to a diaphragm 2101. The lower and upper drive units 2102 and 2103 may include drive electrodes 2201 and 2301 connected to a drive power source 110, which may be an AC power source, and piezoelectric plates 202 and 302 deforming according to voltage.

The diaphragm 2101 is formed of a thin conductive layer, connected to a common power source, and thus can provide ground for drive voltage.

For example, when the first drive electrode 2201 and the second drive electrode 2301 are connected to the AC power source 110 and the diaphragm 2101 of the thin conductive layer is connected to ground 120, electric fields are generated between the first drive electrode 2201 and the diaphragm 2101 and between the second drive electrode 2301 and the diaphragm 2101, respectively.

Here, the electric fields point opposite directions. Thus, the first piezoelectric plate 2202 and the second piezoelectric plate 2302 deform in opposite directions according to the generated electric fields, and the diaphragm 2101 can vibrate according to the deformation.

FIGS. 6A to 6E are cross-sectional views illustrating a method of fabricating a piezoelectric microspeaker according to yet another embodiment. This may serve as an example of a method of fabricating the piezoelectric microspeaker of FIG. 5.

The method of fabricating the piezoelectric microspeaker according to this embodiment will be described below with reference to FIGS. 5 and 6A to 6E.

Figure 6A:
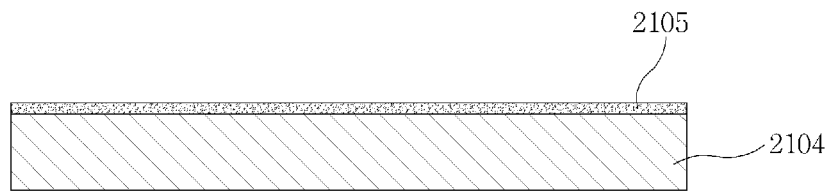
FIGS. 6A to 6E are cross-sectional views illustrating a method of fabricating a piezoelectric microspeaker according to yet another embodiment.

First, as illustrated in FIG. 6A, an insulating layer 2105 is formed by oxidizing the upper surface of a substrate 104 or by depositing a thin insulating layer on the substrate 104.

Figure 6B:
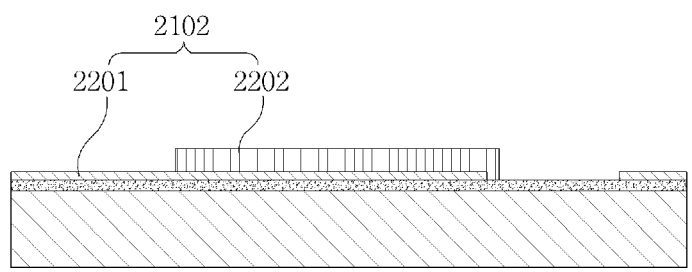

Subsequently, as illustrated in FIG. 6B, the first drive electrode 2201 and the first piezoelectric plate 2202 are formed by depositing and etching a thin conductive layer and a thin piezoelectric layer. The first drive electrode 2201 and the first piezoelectric plate 2202 may constitute the lower drive unit 2102.

Figure 6C:
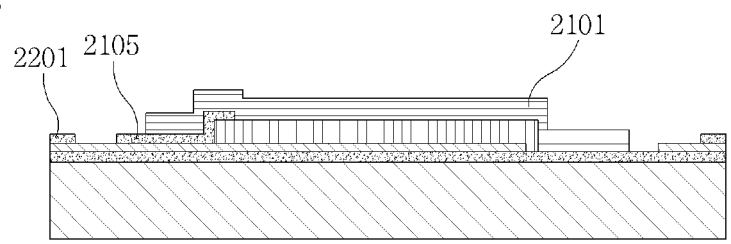

Subsequently, as illustrated in FIG. 6C, an insulating layer 105 for insulation between the diaphragm 2101 and the first drive electrode 2201 is formed, and the diaphragm 2101 is formed by depositing and etching a thin conductive layer. At this time, the center of the diaphragm 2101 can be formed to protrude according to the shape of the lower drive unit 102.

Figure 6D:
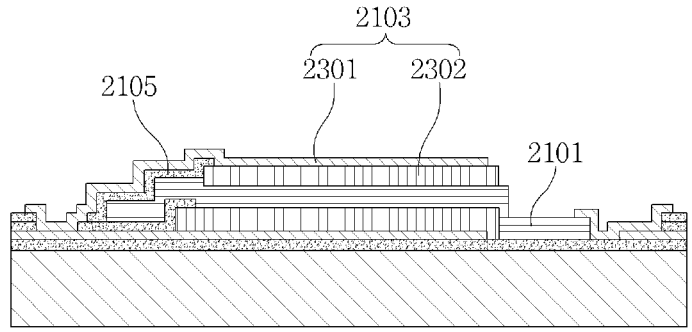

Subsequently, as illustrated in FIG. 6D, the second piezoelectric plate 2302 is formed by depositing and etching a thin piezoelectric layer on the diaphragm 2101, the insulating layer 2105 for insulation between the diaphragm 2101 and the second drive electrode 2301 is additionally formed, and then the second drive electrode 2301 is formed by depositing and etching a thin conductive layer. The second drive electrode 2301 and the second piezoelectric plate 2302 may constitute the upper drive unit 2103. In addition, in this process, the first drive electrode 2201 can be electrically connected with the second drive electrode 2301.

Figure 6E:
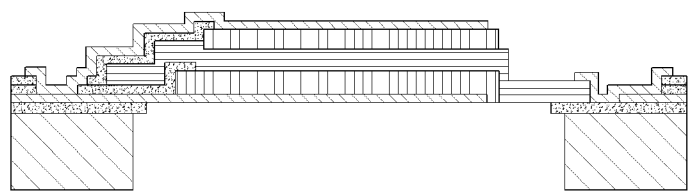

Finally, as illustrated in FIG. 6E, the diaphragm 2101 is released by etching through the lower side of the substrate 104.

Figure 7:
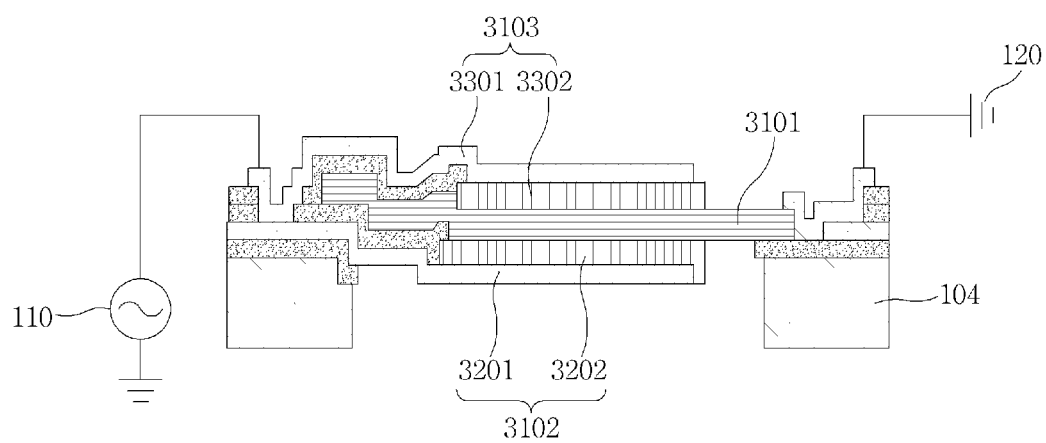
FIG. 7 is a cross-sectional view of a piezoelectric microspeaker according to yet another embodiment.

FIG. 7 is a cross-sectional view of a piezoelectric microspeaker according to yet another embodiment.

Referring to FIG. 7, in the piezoelectric microspeaker according to this embodiment, a lower drive unit 3102 and an upper drive unit 3103 may be symmetrically formed with respect to a diaphragm 3101. The lower and upper drive units 3102 and 103 may include drive electrodes 3201 and 3301 connected to a drive power source 110, and piezoelectric plates 3202 and 3302 deforming according to voltage, respectively.

The structure of FIG. 7 is different from the structure of FIG. 5 in that the diaphragm 3101 is formed to be substantially flat. More specifically, while the center of the diaphragm 2101 protrudes in the structure of FIG. 5 such that the edge of the diaphragm 2101 is disposed at the same level as the lower drive unit 2102, the lower drive unit 3102 is formed at a relatively lower level in the structure of FIG. 7 such that the diaphragm 3101 has a generally flat structure.

As described above, the first drive electrode 3201 and the second drive electrode 3301 are connected to the drive power source 110, and the diaphragm 3101 is formed of a thin conductive layer and connected to a common power source 120.

FIGS. 8A to 8E are cross-sectional views illustrating a method of fabricating a piezoelectric microspeaker according to yet another embodiment. This may serve as an example of a method of fabricating the piezoelectric microspeaker of FIG. 7.

The method of fabricating the piezoelectric microspeaker according to this embodiment will be described below with reference to FIGS. 7 and 8A to 8E.

Figure 8A:
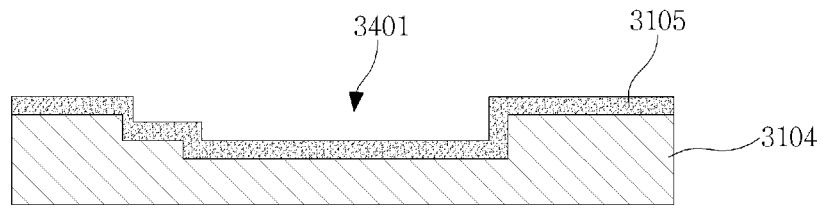
FIGS. 8A to 8E are cross-sectional views illustrating a method of fabricating a piezoelectric microspeaker according to yet another embodiment.

First, as illustrated in FIG. 8A, a cavity 3401 is formed by etching a part of a substrate 3104 to make a space in which the lower drive unit 3102 will be formed, and an insulating layer 3105 is formed by oxidizing the substrate 3104 or by depositing a thin insulating layer on the substrate 3104.

Figure 8B:
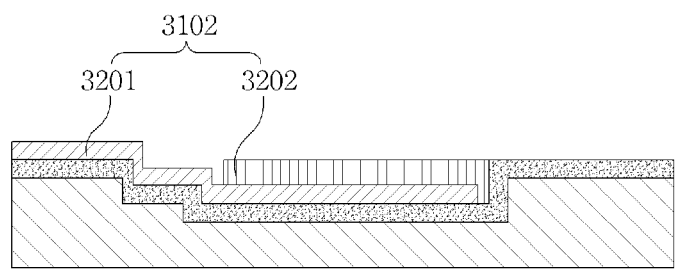

Subsequently, as illustrated in FIG. 8B, the first drive electrode 3201 and the first piezoelectric plate 3202 are formed by depositing and etching a thin conductive layer and a thin piezoelectric layer. The first drive electrode 3201 and the first piezoelectric plate 3202 may constitute the lower drive unit 3102

Figure 8C:
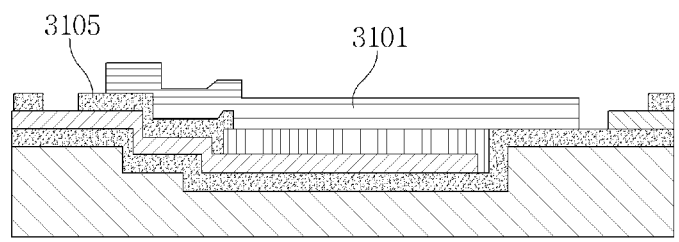

Subsequently, as illustrated in FIG. 8C, an insulating layer 3105 for insulation between the diaphragm 3101 and the first drive electrode 3201 is formed, and the diaphragm 3101 is formed by depositing and etching a thin conductive layer. At this time, a part of the lower drive unit 3102 is disposed within the cavity 3401 of the substrate 3104, and thus the diaphragm 3101 can be formed to be generally flat.

Figure 8D:
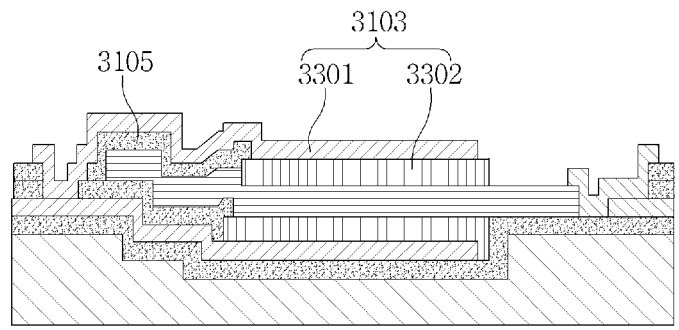

Subsequently, as illustrated in FIG. 8D, the second piezoelectric plate 3302 is formed by depositing and etching a thin piezoelectric layer, the insulating layer 3105 for insulation between the diaphragm 3101 and the second drive electrode 3301 is additionally formed, and then the second drive electrode 3301 is formed by depositing and etching a thin conductive layer. The second piezoelectric plate 3302 and the second drive electrode 3301 may constitute the upper drive unit 3103. In addition, in this process, the first drive electrode 3201 can be electrically connected with the second drive electrode 3301.

Figure 8E:
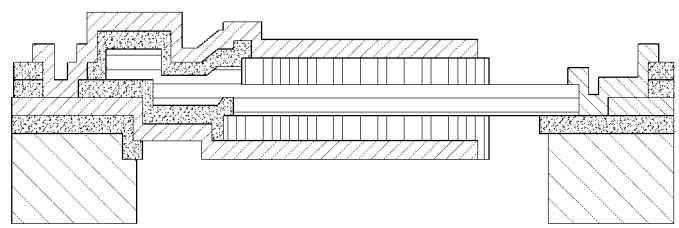

Finally, as illustrated in FIG. 8E, the diaphragm 3101 is released by etching through the lower side of the substrate 104.

It should be understood that the embodiments described herein should be considered in a descriptive sense only and not for purposes of limitation. Descriptions of features or aspects within each embodiment should typically be considered as available for other similar features or aspects in other embodiments.

What is claimed is:

1. A piezoelectric microspeaker fabricated according to a method comprising:
   forming a lower drive unit by:
      forming a first drive electrode by depositing a first thin conductive layer on a substrate and etching the first conductive layer,
      forming a first piezoelectric plate by depositing a first piezoelectric layer on the first drive electrode and etching the first piezoelectric layer, and
      forming a first common electrode by depositing a second conductive layer on the first piezoelectric plate and etching the second conductive layer;
   after the forming the lower drive unit, forming a diaphragm by depositing a non-conductive layer on the first common electrode; and
   forming an upper drive unit by:
      forming a second common electrode by depositing a third conductive layer on the diaphragm and etching the third conductive layer,
      forming a second piezoelectric plate by depositing a second piezoelectric layer on the second common electrode and etching the second piezoelectric layer, and
      forming a second drive electrode by depositing a fourth conductive layer on the second piezoelectric plate and etching the fourth conductive layer.

2. A piezoelectric microspeaker fabricated according to a method comprising:
   forming a lower drive unit by depositing a first conductive layer on a substrate, etching the first conductive layer, depositing a first piezoelectric layer on the first conductive layer, and etching the first piezoelectric layer;
   after the forming the lower drive unit, forming a diaphragm by depositing a second conductive layer on the lower drive unit and etching the second conductive layer; and
   forming an upper drive unit by depositing a second piezoelectric layer on the diaphragm, etching the second piezoelectric layer, depositing a third conductive layer on the second piezoelectric layer, and etching the third conductive layer.

3. The piezoelectric microspeaker of claim 1, wherein the non-conductive layer comprises a polymer.

4. The piezoelectric microspeaker of claim 1, wherein a central region of the diaphragm protrudes in accordance with a shape of the lower drive unit, and wherein an edge region of the diaphragm and the lower drive unit are substantially co-planar.

5. The piezoelectric microspeaker of claim 1, wherein the method further comprises:
   prior to the forming the lower drive unit, etching a part of the substrate to form a cavity, wherein the lower drive unit is formed substantially within the cavity.

6. The piezoelectric microspeaker of claim 5, wherein the diaphragm is substantially planar.

7. The piezoelectric microspeaker of claim 2, wherein a central region of the diaphragm protrudes in accordance with a shape of the lower drive unit, and
   wherein an edge region of the diaphragm and the lower drive unit are substantially co-planar.

8. The piezoelectric microspeaker of claim 2, wherein the method further comprises:
   prior to the forming the lower drive unit, etching a part of the substrate to form a cavity, wherein the lower drive unit is formed substantially within the cavity.

9. The piezoelectric microspeaker of claim 2, wherein the diaphragm is substantially planar.

* * * * *